US010910115B2

(12) United States Patent
Nicholson et al.

(10) Patent No.: US 10,910,115 B2
(45) Date of Patent: Feb. 2, 2021

(54) DIGITAL SYSTEMS AND METHODS FOR HIGH PRECISION CONTROL IN NUCLEAR REACTORS

(71) Applicant: GE-Hitachi Nuclear Energy Americas LLC, Wilmington, NC (US)

(72) Inventors: Jerry W. Nicholson, Wilmington, NC (US); Cesar M. Velasquez, Charlotte, NC (US); Kenneth A. Morgan, Wilmington, NC (US)

(73) Assignee: GE-Hitachi Nuclear Energy Americas LLC, Wilmington, NC (US)

( * ) Notice: Subject to any disclaimer, the term of this patent is extended or adjusted under 35 U.S.C. 154(b) by 607 days.

(21) Appl. No.: 15/453,195

(22) Filed: Mar. 8, 2017

(65) Prior Publication Data
US 2018/0261339 A1    Sep. 13, 2018

(51) Int. Cl.
*G21C 7/36*    (2006.01)
*G21C 17/12*    (2006.01)
(Continued)

(52) U.S. Cl.
CPC ............... *G21C 7/36* (2013.01); *G21C 17/12* (2013.01); *G21D 3/001* (2013.01); *G21C 7/14* (2013.01);
(Continued)

(58) Field of Classification Search
CPC . G21C 7/12; G21C 7/36; G21C 17/12; G05B 15/02; G21D 3/001; H03M 1/001
See application file for complete search history.

(56) References Cited

U.S. PATENT DOCUMENTS

| 2,917,445 A | 12/1959 | Oakes et al. |
| 3,391,058 A * | 7/1968 | Gilbert .................. G21C 7/08 376/217 |

(Continued)

FOREIGN PATENT DOCUMENTS

| EP | 1806754 | 7/2007 |
| EP | 2945165 | 11/2015 |

(Continued)

OTHER PUBLICATIONS

GE-Hitachi ESBWR Design Control Document Tier 2, Rev. 10—excerpts from chapters 4 and 7. Apr. 2014. (Year: 2014).*

(Continued)

*Primary Examiner* — Lily C Garner
(74) *Attorney, Agent, or Firm* — Ryan Alley IP

(57) ABSTRACT

Control rod drives include all-digital monitoring, powering, and controlling systems for operating the drives. Each controlling system includes distinct microprocessor-driven channels that independently monitor and handle control rod drive position information reported from multiple position sensors per drive. Controlling systems function as rod control and information systems with top-level hardware interfaced with nuclear plant operators other plant systems. The top-level hardware can receive operator instructions and report control rod position, as well as report errors detected using redundant data from the multiple sensors. Positional data received from each drive is multiplexed across plural, redundant channels to allow verification of the system using independent position data as well as operation of the system should a single channel or detector fail. Control rod drives are capable of positioning and detecting position of control elements in fine increments, such as 3-millimeter increments, with plural position sensors that digitally report drive status and position.

13 Claims, 3 Drawing Sheets

(51) Int. Cl.
*G21D 3/00* (2006.01)
*G21C 7/14* (2006.01)
*H03M 1/00* (2006.01)

(52) U.S. Cl.
CPC .............. *H03M 1/00* (2013.01); *H03M 1/001* (2013.01); *Y02E 30/30* (2013.01)

(56) References Cited

U.S. PATENT DOCUMENTS

| | | | | |
|---|---|---|---|---|
| 4,170,754 | A * | 10/1979 | Schmitz | G01D 5/2046 |
| | | | | 324/207.17 |
| 4,629,983 | A * | 12/1986 | Boomgaard | G21C 17/12 |
| | | | | 324/207.19 |
| 5,581,586 | A | 12/1996 | Sunami et al. | |
| 8,670,515 | B2 | 3/2014 | Roslund et al. | |
| 8,761,329 | B2 * | 6/2014 | Carvajal | G21C 17/102 |
| | | | | 376/247 |
| 9,697,916 | B2 * | 7/2017 | Shumaker | G21C 17/12 |
| 10,446,278 | B2 * | 10/2019 | Caylor | G21C 17/00 |
| 2007/0153955 | A1 | 7/2007 | Curbo et al. | |
| 2009/0120263 | A1 * | 5/2009 | Suzuki | B26D 3/02 |
| | | | | 83/865 |
| 2011/0026660 | A1 | 2/2011 | Meier et al. | |
| 2014/0016732 | A1 | 1/2014 | Baang et al. | |
| 2014/0369455 | A1 | 12/2014 | McCulley et al. | |
| 2015/0332795 | A1 | 11/2015 | Kodama et al. | |
| 2020/0258643 | A1 * | 8/2020 | Chang | G01D 5/2208 |

FOREIGN PATENT DOCUMENTS

| | | |
|---|---|---|
| JP | 08021891 | 1/1996 |
| KR | 100841528 B1 * | 6/2008 |
| KR | 101376915 | 3/2016 |
| WO | 2011014352 | 2/2011 |

OTHER PUBLICATIONS

"The ESBWR Plant General Description," Chapter 3—Nuclear Steam Supply Systems, Control Rod Drive System, Jun. 1, 2011.
WIPO, International Search Report and Written Opinion in corresponding PCT application PCT/US2018/021431, dated Sep. 17, 2018.
EPO, Extended European Search Report in corresponding EP Application 18763447.2, dated Oct. 21, 2020.

* cited by examiner

DIGITAL SYSTEMS AND METHODS FOR HIGH PRECISION CONTROL IN NUCLEAR REACTORS

BACKGROUND

FIG. 1 is a cross-sectional illustration of a related art control rod drive 10 useable in a nuclear reactor. For example, related art control rod drive 10 may be a Fine Motion Control Rod Drive (FMCRD) as used in next generation BWRs like ESBWRs. As shown in FIG. 1, control rod drive is housed outside, such as below, reactor pressure vessel 1, where drive 10 inserts or withdraws a control element, such as a control blade (not shown), attached thereto via bayonet coupling 15. Hollow piston 16 connects to bayonet coupling 15 and is vertically moveable inside of an outer tube in drive 10. Drive 10 includes ball screw 11 coupled with ball nut 12 that drives screw 11 vertically when rotated, such that hollow piston 16, bayonet coupling 15, and the control element attached thereto may be positioned with precision at desired positions in a nuclear reactor core. During scram, hollow piston 16 may be lifted off ball nut 12 by hydraulic pressure in the outer tube, permitting rapid movement and insertion of the control element. A magnetic coupling 17 pairs internal and external magnets to rotate ball screw 11 across a pressure barrier, and a motor and brake 19 mounted below drive and stop magnetic coupling 17 to desired positioning.

Power and control is provided to control rod drive by a Rod Control & Information System (RC&IS) that in varying conventional designs uses a mix of analog systems and digital transducers, including resolvers and synchros and encoders, and any required analogue-to-digital converters, coupled to motor and brake 19 to provide position detection, control, and power to the same. Several existing mixed analog and digital systems are able to detect and resolve position of associated control elements to several centimeters, with coarser position control. Related descriptions of drive 10 and FMCRD technology are found in GE-Hitachi Nuclear Energy, "The ESBWR Plant General Description," Chapter 3—Nuclear Steam Supply Systems, Control Rod Drive System, Jun. 1, 2011, incorporated herein by reference in its entirety.

SUMMARY

Example embodiments include all-digital control rod drives and associated systems for monitoring, powering, and controlling the drives. Control and information systems may be divided into distinct channels with switches and controls of each channel performing independent and redundant control rod drive monitoring and controlling. Control and information systems may separately be divided among main control logic associated with plant operators and top-level input from other plant systems, remote cabinet equipment including multiplexed data handling for transmission to the main control logic, fine motion controllers associated with each control rod drive, and the control rod drive themselves. Each of these subsystems may pass control rod drive position information from multiple position sensors to the plant operators and other plant systems. Each piece of position information from an individual sensor, such as a digital position transducer, may be handled by one of the distinct channels of the control and information systems. Because the entire system, including control rod drives and control and information systems, may work with digital information on computer hardware processors and associated memories and busses, no digital-to-analog or analog-to-digital converter is necessary. By connecting and multiplexing each channel throughout the system, controllers associated with each channel may verify accuracy of position information with controllers of other channels, and redundant commands and data may be transmitted and received even if one channel or sensor fails.

Control rod drives useable in example embodiments include fine motion control rod drives capable of positioning and detecting position of control elements in very fine increments, such as 3-millimeter increments, such as with rotating servo motors. Example control rod drives may further include several position sensors that digitally report control rod drive status and insertion position in these fine increments. A single control and information system may receive the multiple position sensor readings from multiple control drive systems and control the same using appropriate powering and control signals to achieve desired control rod positioning.

BRIEF DESCRIPTIONS OF THE DRAWINGS

Example embodiments will become more apparent by describing, in detail, the attached drawings, wherein like elements are represented by like reference numerals, which are given by way of illustration only and thus do not limit the terms which they depict.

DETAILED DESCRIPTION

Figure 1:
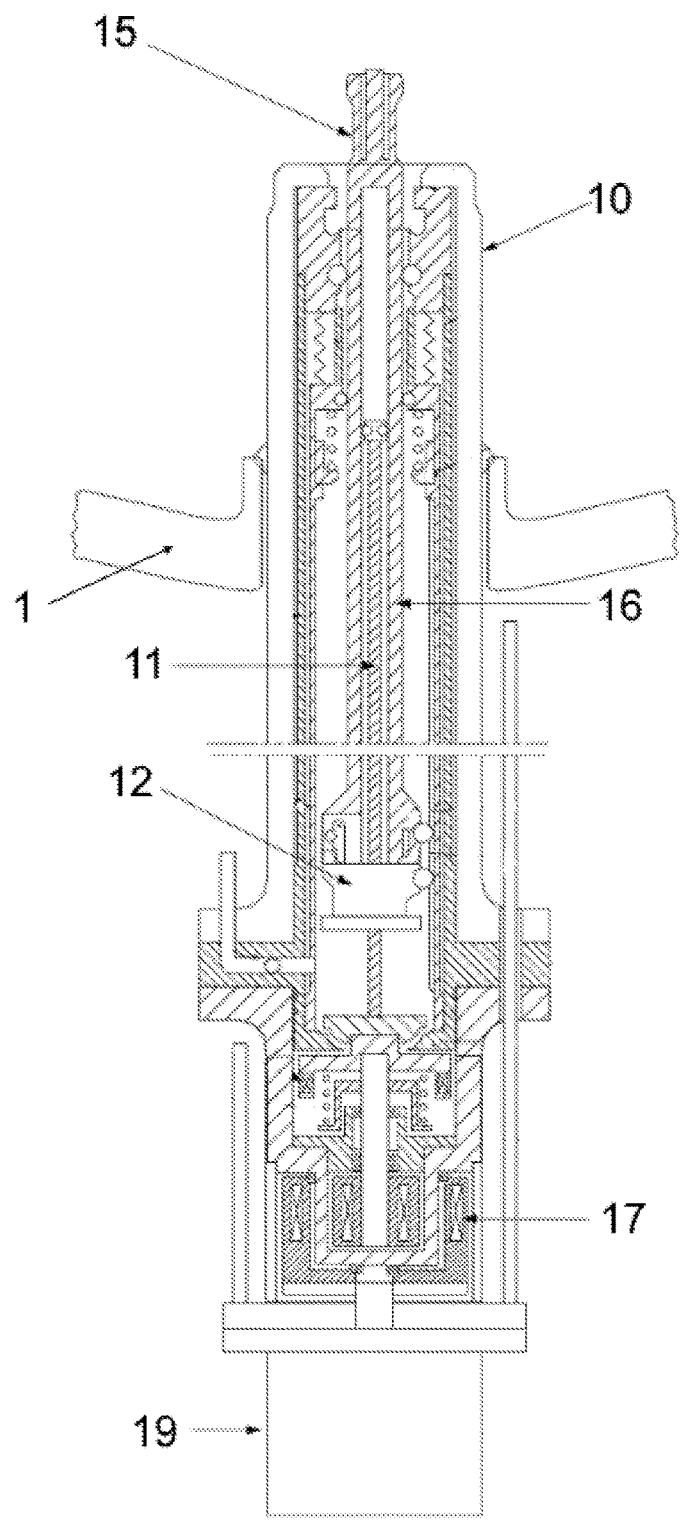
FIG. 1 is an illustration of a related art nuclear control rod drive.

Because this is a patent document, general broad rules of construction should be applied when reading it. Everything described and shown in this document is an example of subject matter falling within the scope of the claims, appended below. Any specific structural and functional details disclosed herein are merely for purposes of describing how to make and use examples. Several different embodiments and methods not specifically disclosed herein may fall within the claim scope; as such, the claims may be embodied in many alternate forms and should not be construed as limited to only examples set forth herein.

It will be understood that, although the terms first, second, etc. may be used herein to describe various elements, these elements should not be limited to any order by these terms. These terms are used only to distinguish one element from another; where there are "second" or higher ordinals, there merely must be that many number of elements, without necessarily any difference or other relationship. For example, a first element could be termed a second element, and, similarly, a second element could be termed a first element, without departing from the scope of example embodiments or methods. As used herein, the term "and/or" includes all combinations of one or more of the associated listed items. The use of "etc." is defined as "et cetera" and indicates the inclusion of all other elements belonging to the same group of the preceding items, in any "and/or" combination(s).

It will be understood that when an element is referred to as being "connected," "coupled," "mated," "attached," "fixed," etc. to another element, it can be directly connected to the other element, or intervening elements may be present. In contrast, when an element is referred to as being "directly connected," "directly coupled," etc. to another element, there are no intervening elements present. Other words used to describe the relationship between elements should be interpreted in a like fashion (e.g., "between" versus "directly between," "adjacent" versus "directly adjacent," etc.). Similarly, a term such as "communicatively connected" includes all variations of information exchange and routing between two electronic devices, including intermediary devices, networks, etc., connected wirelessly or not.

As used herein, the singular forms "a," "an," and "the" are intended to include both the singular and plural forms, unless the language explicitly indicates otherwise. It will be further understood that the terms "comprises," "comprising," "includes," and/or "including," when used herein, specify the presence of stated features, characteristics, steps, operations, elements, and/or components, but do not themselves preclude the presence or addition of one or more other features, characteristics, steps, operations, elements, components, and/or groups thereof.

The structures and operations discussed below may occur out of the order described and/or noted in the figures. For example, two operations and/or figures shown in succession may in fact be executed concurrently or may sometimes be executed in the reverse order, depending upon the functionality/acts involved. Similarly, individual operations within example methods described below may be executed repetitively, individually or sequentially, so as to provide looping or other series of operations aside from single operations described below. It should be presumed that any embodiment or method having features and functionality described below, in any workable combination, falls within the scope of example embodiments.

The inventors have recognized that existing locking collet piston and magnetic jack type control rod drives lack precision, being able to move in increments of 6 inches or more. Typical ESBWRs and other large, natural-circulation-dependent reactors require greater precision for reactivity control. Related FMCRD, such as in the ABWR, while having greater precision, are operated using analog sensors such as synchros and servos, which require an analog-to-digital converter for control. The use of analog sensors results in decrease of precision accuracy. Moreover, controls for FMCRD need to have very high reliability in nuclear applications, and single-channel analog controls represent an impermissible failure risk for lack of redundancy. Example embodiments described below address these and other problems recognized by the Inventors with unique solutions enabled by example embodiments.

The present invention is a control rod drive control and information system. In contrast to the present invention, the small number of example embodiments and example methods discussed below illustrate just a subset of the variety of different configurations that can be used as and/or in connection with the present invention.

Example embodiment control rod drive (CRD) control and information systems are useable with several different types of CRDs. Example embodiments are further useable with high-precision CRDs, including FMCRDs. Further, co-owned applications 62/361,628, filed Jul. 28, 2016 by Morgan et al., 62/361,625, filed Jul. 13, 2016 by Morgan et al., and 62/361,604, filed Jul. 13, 2016 by Morgan et al. are incorporated herein by reference in their entireties. These incorporated applications describe high-precision CRDs that are useable with example embodiments; for example, example embodiment control systems may be interfaced with, and control, the control rod drives disclosed in the incorporated applications.

Figure 2:
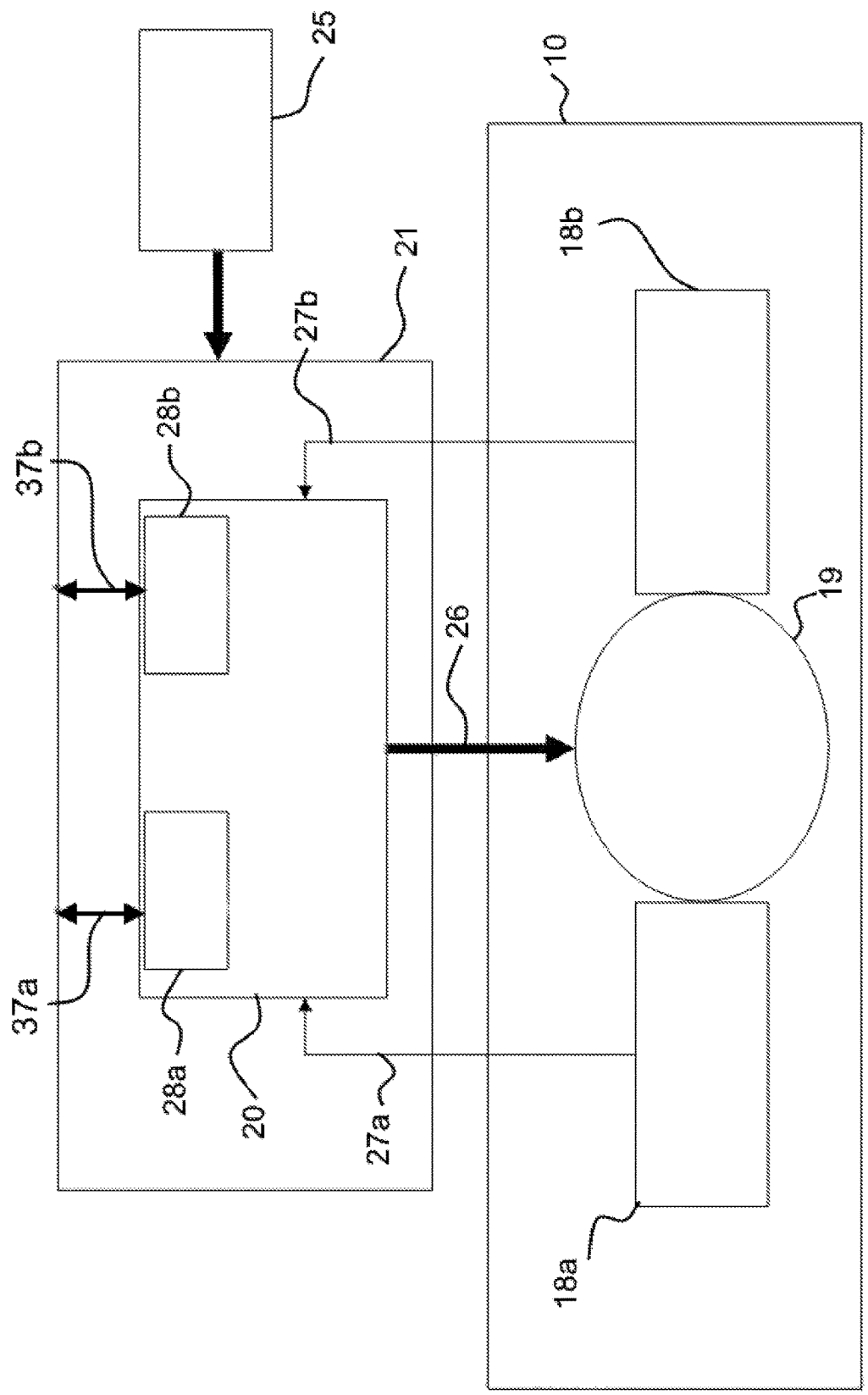
FIG. 2 is a schematic of a fine motion control rod drive motor and its motor control cabinet.

FIG. 2 is a schematic of FMCRD 10 where motor 19 and output of the FMCRD interface with an example embodiment system 100. As shown in FIG. 2, motor 19 may receive power and operative signals from a motor control cabinet 21 over motor interface 26. For example, motor interface 26 may be radiation-hardened power cables that deliver electrical power, such as three-phase pulse-width modulated electrical signals, and/or information like speed controls to motor 19 in challenging environments such as operating nuclear reactor environments. Fine motion motor controller 20 may receive such power from a plant power source 25, including main plant electrical bus, local battery, emergency generators, or any other source of power.

Motor controller 20 is configured to power motor interface 26 for both very fine intervals and very large power jumps. In this way, motor 19 may be powered to move a control blade attached to FMCRD 10 at very precise intervals, such as 3 millimeter vertical insertions or withdrawals, as well as rapid, large insertion strokes for shutdown. For example, motor 19 may be a servo motor that is controllable up to $\frac{1}{4}^{th}$ of one revolution of a ball screw in FMCRD 10 that can self-brake and provide long-term static torque. A full revolution may equate to 12 millimeters of vertical control element movement, so positioning on an order of a few millimeters is possible. Delivery of a precise amount of power through motor interface 26 may thus achieve desired precise motor actuation and control element positioning.

FMCRD 10 may include multiple position detectors 18a and 18b, such as precise digital transducers that can determine an exact vertical position of ball nut 12 and/or other connective structures to report an accurate position of a control element within one-thirty-sixth of a millimeter. Position detectors 18a and 18b may be redundant or measure position of related structures as a verification of control element positioning. For example, two digital transducers as position detectors 18a and 18b may be coupled directly to a power output or shaft of motor 19 that encode rotations of the same to digitally represent motor 19 position and thus control element position. Because position detectors 18a and 18b may give digital output, informational positional signal interfaces 27a and 27b may be any connection capable of carrying digital signals, including fiber optic cable, coaxial cables, wireless signals, etc., separate or combined with motor interface 26.

Fine motion motor controller 20 includes two channel interfaces 28a and 28b each configured to receive digital position information from an associated one of detectors 18a and 18b via positional signal interfaces 27a and 27b. Channel interfaces 28a and 28b may separately handle individual positional signals and control inputs so as to preserve integrity of a redundant system and allow different signals to be verified against one another without intermixing or single failure affecting both signals. Fine motion motor control cabinet 21 housing motor controller 20 and various interfaces and communicative connections may be local or remote from FMCRD 10. Because all components of cabinet 20 may be digital with no analog-to-digital converter, cabinet 20 may be relatively small and better hardened against an operating nuclear reactor environment.

Figure 3:
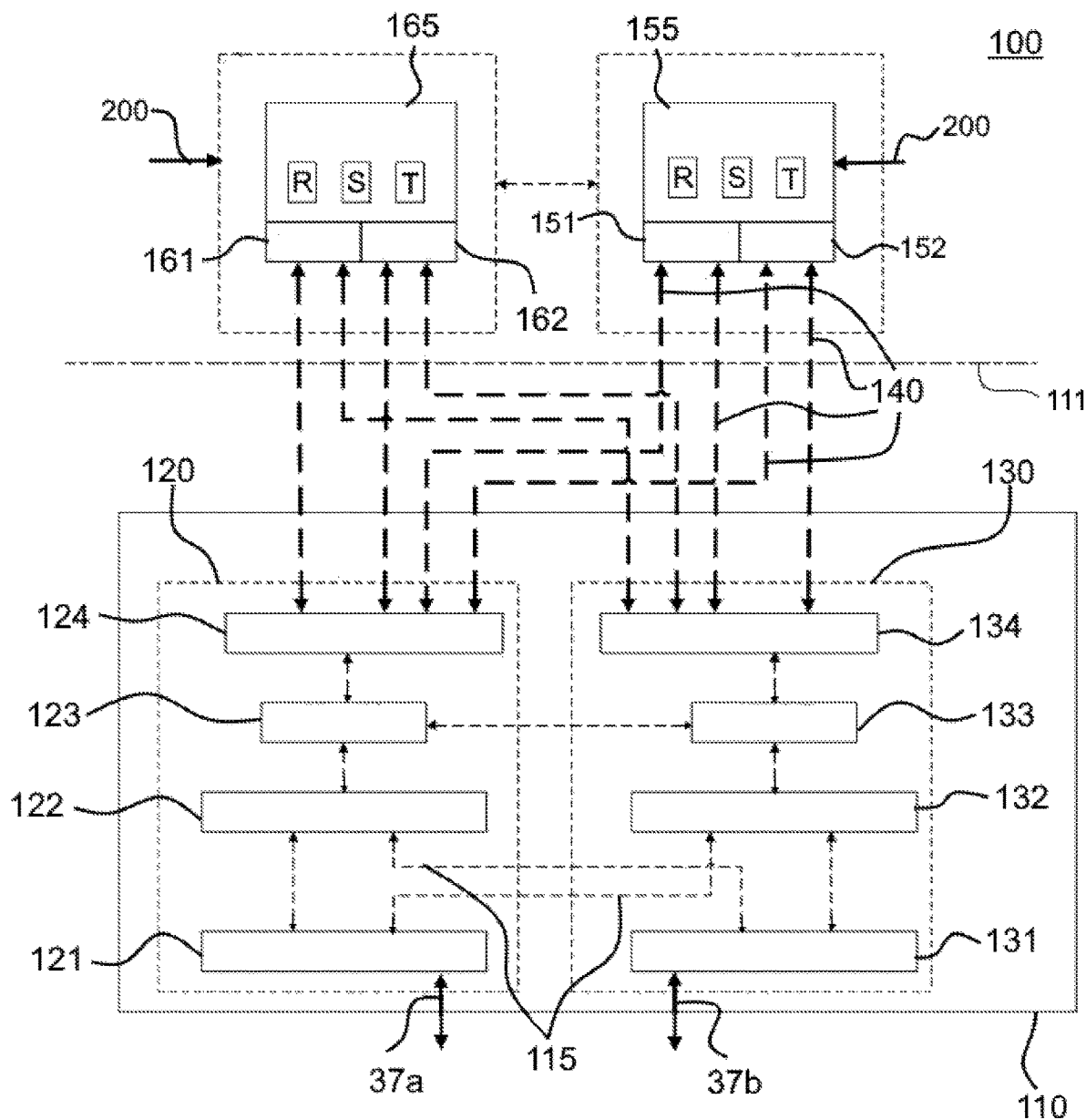
FIG. 3 is a schematic of an example embodiment digital rod control and information system.

FIG. 3 is a schematic diagram of an example embodiment digital rod control and information system (RC&IS) 100. As shown in FIG. 3, example embodiment RC&IS 100 interfaces with a FMCRD 10 and fine motion motor controller 20 (FIG. 2) through remote links 37a and 37b. RC&IS 100 may be located closer to an operator or control room, outside of containment and remote from FMCRD 10 and its motor control cabinet 21 (FIG. 2), in which case remote links 37a and 37b may be any kind of digital data connection, including higher-reliability fiber optic cables or wireless connections. Remote links 37a and 37b together communicate dual-channel positional data from an FMCRD, such as digital positional data generated by position detectors 18a and 18b for redundant position determination of individual control elements.

RC&IS 100 includes remote communication cabinet equipment 110 networked with an RC&IS main control logic 111 that is configured to receive input 200 from operators and other plant systems for control element operation and positioning. RC&IS 100 is completely digital, using microprocessors, field-programmable gate arrays, and digital communications for higher reliability and less space requirement. Cabinet equipment 110 may be all stored in a discreet and smaller cabinet remote or local to a control rod drive. For example, cabinet equipment 110, lacking any analog-to-digital converter, may fit in a relatively small space and handle control element operations for a quarter of a nuclear core. Moreover, all-digital RC&IS 100 is less susceptible to noise and vibration found in an operating nuclear operating environment and thus can be located anywhere in a nuclear plant and can perform self-testing and alerting functions to maintain desired operations with lower failure rates than analog equipment.

Example embodiment RC&IS 100 is configured to handle and control an FMCRD with dual, redundant inputs to maintain operations in the case of single-channel failure, such as if a single position detector becomes unusable or signals are lost from one channel in example embodiments. As shown in FIG. 3, RC&IS 100 includes two independent channels 120 and 130 in its cabinet equipment 110, each in communication with an individual position data source such as remote links 37a and 37b. Although shown in communication with a single set of remote links 37a and 37b, it is understood that multiple FMCRDs and related motor controls may be input into and controlled by cabinet equipment 110, including an entire core quadrant's worth of control drives.

Each channel 120 and 130 independently handles distinct digital position and operation signals; however, channels 120 and 130 are also connected in order to verify and potentially replace one another. Bus communications 115 between all elements of channels 120 and 130 may be typical digital communications lines, including internal computer buses, motherboard connections, wired connections, or wireless connections. Each channel 120 and 130 includes multiplexed and redundant switches 121, 122, 124, 131, 132, and 134. Switches 122, 124, 132, and 134 may receive positional data and issue motor command signals, as well as other data, for each control rod drive associated with RC&IS 100. As shown by bus communications 115, switches 121 and 122 associated with channel 120 may include connection to switches 131 and 132 of the other channel 130. Thus, if a switch fails in either channel, or if other channel components become inoperative, the operative channel and switches therein may still receive, transmit, and otherwise handle all control information.

Each channel 120 and 130 includes a controller 123 and controller 133, respectively. The controllers 123 and 133 may receive, buffer, issue, and interpret control rod drive operational data. For example, controllers 123 and 133 may receive rod movement commands from RC&IS control channel controllers 165 and 155, and such commands may be interpreted and sent to one or more motor controllers 20 (FIG. 2) through remote links 37a and 37b. Motor controller 20 (FIG. 2) may then provide power transmission to a motor 19 through motor interface 21 (FIG. 2) to achieve desired driving, braking, and position from detectors 18a and 18b (FIG. 2), interpreted for operator readout.

As shown in FIG. 3, controllers 123 and 133 may also perform comparison of rod movement commands from the RC&IS control logic controllers 155 and 165 to ensure that inconsistent rod movement commands do not result in rod movement. Switches 124 and 134 may provide redundant data links between each RC&IS logic channel controller 165 and 155, and each remote cabinet controller 123 and 133. Switches 122, 132, 121, and 131 may provide redundant data links between each controller 123 and 133 and multiple motor controllers 20 (FIG. 2).

As shown in FIG. 3, each controller 123 and 133 in channel 120 and 130 interfaces with an input/output switch 124 and 134 for sending and receiving operational data to operator controllers in RC&IS main control logic 111. Because main control logic 111 interfaces with several other plant safety systems and operator controls, control logic 111 is typically located in or near a control room or other plant operator station. Input/output switches 124 and 134 multiplex control commands and information from both channels over main logic interfaces 140 to main control logic 111. For example, main control logic may include two or more main RC&IS channel controllers 165 and 155, each with two switches 161, 162, 151, and 152. Main logic interfaces 140 may be multiplexed to provide digital information and control data from both channels 120 and 130 to each switch 151, 152, 161, and 162. In this way, main RC&IS channel controllers 155 and 165 may have redundant switches that each have access to both channels associated with each control rod drive.

Main RC&IS channel controllers 155 and 165 receive and implement operator feedback and input, including control element positioning commands, as well as input 200 from other plant systems, such as plant steady-state information or trip alerts. Because each main controller 155 and 165 receives redundant control and command data, and can issue redundant commands to independent channels 120 and 130, either controller 155 and 165 may be used to report on and operate all aspects of a control drive, regardless of failure of the other controller and/or of channel equipment or position reporting equipment.

Similarly, because main RC&IS channel controllers 155 and 165 may themselves be connected and communicate through an internal bus or other plant communicative connections, controllers 155 and 165 may verify positional and operational data received as well as operator inputs between themselves. Controllers 155 and 165 may be configured to detect discrepancies between information received from either channel 120 and 130, as well as inputs 200 or operator controls received by them both. Upon detection of a discrepancy, an operator may be notified and/or a channel may be identified as out-of-service. For example, an operator or plant control system may input a very fine control element repositioning, such as 3 mm, for a single control blade, and system 100 may receive and process the move, resulting in rod movement commands to the motor controller 20 and appropriate power and signaling transmitted to motor 19 from the motor controller 20 through motor interface 26 (FIG. 2). Position detectors 18a and 18b (FIG. 2) may then report digital, accurate rod repositioning information, which may be processed by the motor controller 20 and transmitted to the remote controllers 123 and 133, which may interpret and transmit the rod repositioning information to the main controllers 165 and 155. Main controllers 165 and 155 may verify this position data from both channels and thus detectors, and ensure it reflects the input command. Because channel controllers 155 and 165 are themselves digital, such analysis and notification or disregarding of bad channel data may be implemented as simple programming or hardware structuring in microprocessors of controllers 155 and 165. Each channel of RC&IS controller logic, 155 and 165, may contain one or more microprocessors, such as three redundant microprocessors R, S, and T each performing the same RC&IS logic computations independently and asynchronously of each other. Redundant microprocessors in each RC&IS control logic channel, 165 and 155 may ensure detectability and continuity of rod control logic functions in the presence of a single microprocessor failure.

Example embodiment RC&IS 100 is end-to-end digital, handling data and commands received directly from digital inputs and outputs. Such digitization allows for a smaller footprint, faster analysis and action, less susceptibility to noise, vibration, heat, and radiation damage, finer motor control and monitoring, and easier handling of multiple-channel data for redundancy and verification in control rod drive operation. Further, connections among various components, such as by internal connections 115 or connections 140 between potentially remotely-situated cabinet 110 and main logic 111, may be reliable communicative connections between systems, including internal busses on motherboards, fiber optic cables, etc.

Example embodiments and methods thus being described, it will be appreciated by one skilled in the art that example embodiments may be varied and substituted through routine experimentation while still falling within the scope of the following claims. For example, although only one FMCRD 10 is shown schematically connected to example embodiment system 100, use of multiple different FMCRDs, as well as other types of control rod drives for a variety of different reactor sizes and configurations are compatible with example embodiments and methods simply through proper dimensioning of example embodiments—and fall within the scope of the claims. Such variations are not to be regarded as departure from the scope of these claims.

What is claimed is:

1. A digital system for operating a control rod drive in a nuclear power plant, the digital system comprising:
    a first channel controller system configured to receive digital position information from a first control rod drive position sensor in the control rod drive; and
    a second channel controller system configured to receive digital position information from a second control rod drive position sensor in the control rod drive, wherein the first channel controller and second channel controller systems are configured to report a position of the control rod based on the received digital position information from the first and the second control rod drive position sensors, wherein the first channel controller system and the second channel controller system are further configured to transmit digital operation signals to the control rod drive, and wherein the system does not include any analog-to-digital converter.

2. The system of claim 1, wherein the first channel controller system includes a first channel controller and a first main RC&IS channel controller, and wherein the second channel controller system includes a second channel controller and a second main RC&IS channel controller.

3. The system of claim 2, further comprising:
    a remote connection multiplexing the first and the second channel controllers in the first channel and the second channel controller systems into the first and the second main RC&IS channel controllers such that each of the first and the second channel controllers in the first channel and the second channel controller systems is digitally connected to all of the first and the second main RC&IS channel controllers.

4. The system of claim 3, wherein the remote connection is fiber optic cable.

5. The system of claim 2, wherein the first and the second channel controllers are in a cabinet remote from the control rod drive and from the first and the second main RC&IS channel controllers in the nuclear power plant.

6. The system of claim 5, wherein the first and the second main RC&IS channel controllers are operable from a control room of the nuclear power plant and receive information from other systems of the nuclear power plant.

7. The system of claim 1, further comprising:
    the control rod drive, wherein the control rod drive is a fine motion control rod drive having a servo motor configured to move a control element in 3 millimeter vertical increments.

8. The system of claim 7, wherein the first control rod drive position sensor and the second control rod drive position sensor are paired with the motor and are digital transducers that measure a rotational position of the motor.

9. The system of claim 7, further comprising:
    a fine motion motor controller interfaced between the control rod drive and the first and the second channel controller systems.

10. The system of claim 9, wherein the first channel controller and the second channel controller systems are further configured to transmit operation signals to the control rod drive, and wherein the fine motion motor controller delivers electrical power to the motor based on the transmitted operation signals.

11. The system of claim 9, wherein the first and the second channel controller systems are further configured to receive digital position information from a plurality of the first control rod drive position sensors and the second control rod drive position sensors coupled to a plurality of the control rod drives.

12. The system of claim 1, wherein the first channel controller system includes a first channel controller and a first main RC&IS channel controller, and wherein the second channel controller system includes a second channel controller and a second main RC&IS channel controller, and wherein the each of the first and the second channel controllers are connected by remote connection to all of the first and the second main RC&IS channel controllers.

13. A digital system for operating a control rod drive in a nuclear power plant, the digital system comprising:
    a first channel controller system configured to receive digital position information from a first control rod drive position sensor in the control rod drive, wherein the first channel controller system includes a first channel controller and a first main RC&IS channel controller;
    a second channel controller system configured to receive digital position information from a second control rod drive position sensor in the control rod drive, wherein the second channel controller system includes a second channel controller and a second main RC&IS channel controller; and
    a remote connection multiplexing the first channel controller and the second channel controller into the first and the second main RC&IS channel controllers such that each of the first channel and the second channel controllers is digitally connected to all of the first and the second main RC&IS channel controllers, wherein the system does not include any analog-to-digital converter, and wherein the first and the second main RC&IS channel controllers each, include two switches, include an import/output switch connected by the remote connection to all of the two switches of the first and the second main RC&IS channel controllers, and are configured to report a position of the control rod based on the received digital position information from the first and the second control rod drive position sensors.

\* \* \* \* \*